United States Patent
Wang et al.

(10) Patent No.: US 11,860,382 B2
(45) Date of Patent: Jan. 2, 2024

(54) OPTICAL LENS STRUCTURE, METHOD FOR MANUFACTURING THE SAME, AND DISPLAY APPARATUS

(71) Applicant: BOE Technology Group Co., Ltd., Beijing (CN)

(72) Inventors: Can Wang, Beijing (CN); Can Zhang, Beijing (CN); Minghua Xuan, Beijing (CN); Xiaochuan Chen, Beijing (CN); Angran Zhang, Beijing (CN); Han Yue, Beijing (CN); Ming Yang, Beijing (CN); Ning Cong, Beijing (CN); Jiao Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 607 days.

(21) Appl. No.: 16/841,883

(22) Filed: Apr. 7, 2020

(65) Prior Publication Data

US 2021/0132261 A1    May 6, 2021

(30) Foreign Application Priority Data

Nov. 6, 2019    (CN) .......................... 201911078250.6

(51) Int. Cl.
| | | |
|---|---|---|
| *G02B 3/00* | (2006.01) | |
| *G02B 5/00* | (2006.01) | |
| *G02B 5/20* | (2006.01) | |
| *H10K 50/844* | (2023.01) | |
| *H10K 50/858* | (2023.01) | |
| *H10K 50/86* | (2023.01) | |

(Continued)

(52) U.S. Cl.
CPC ........... *G02B 3/0012* (2013.01); *G02B 5/003* (2013.01); *G02B 5/201* (2013.01); *H10K 50/844* (2023.02); *H10K 50/858* (2023.02); *H10K 50/865* (2023.02); *H10K 59/12* (2023.02); *H10K 59/38* (2023.02)

(58) Field of Classification Search
CPC ...... G02B 3/0012; G02B 5/003; G02B 5/201; H01L 27/322; H01L 27/3244; H01L 51/5253; H01L 51/5275; H01L 51/5284
See application file for complete search history.

(56) References Cited

U.S. PATENT DOCUMENTS

| | | | | |
|---|---|---|---|---|
| 8,963,138 B2 * | 2/2015 | Lim | .................... | H01L 51/5275 313/506 |
| 2015/0084026 A1 * | 3/2015 | Miyamoto | ............ | H01L 27/322 257/40 |

FOREIGN PATENT DOCUMENTS

| | | |
|---|---|---|
| CN | 102213785 A | 10/2011 |
| CN | 104678641 A | 6/2015 |
| CN | 108919403 A | 11/2018 |

(Continued)

OTHER PUBLICATIONS

First Office Action dated Nov. 25, 2020 corresponding to Chinese application No. 201911078250.6.

*Primary Examiner* — Anne M Hines
(74) *Attorney, Agent, or Firm* — Nath, Goldberg & Meyer; Joshua B. Goldberg

(57) ABSTRACT

The disclosure provides an optical lens structure, a method for manufacturing the same, and a display apparatus. The optical lens structure includes a substrate layer; and a plurality of optical lenses on the substrate layer. The optical lens includes a color resist material; the optical lenses are arranged in an array, and color resist materials of adjacent optical lenses have different colors from each other.

15 Claims, 2 Drawing Sheets

(51) Int. Cl.
*H10K 59/12* (2023.01)
*H10K 59/38* (2023.01)

(56) References Cited

FOREIGN PATENT DOCUMENTS

| | | |
|---|---|---|
| CN | 109659346 A | 4/2019 |
| CN | 110288904 A | 9/2019 |

* cited by examiner

OPTICAL LENS STRUCTURE, METHOD FOR MANUFACTURING THE SAME, AND DISPLAY APPARATUS

CROSS-REFERENCE TO RELATED APPLICATIONS

The application claims the priority of Chinese Patent Application No. 201911078250.6, filed on Nov. 6, 2019, the contents of which are incorporated herein by reference in their entirety.

TECHNICAL FIELD

The present disclosure relates to the field of display technology, in particular, to an optical lens structure, a method for manufacturing the same, and a display apparatus.

BACKGROUND

With the continuous development of augmented reality (AR) technology, requirements on the lightness and thinness of AR products are higher. In the related art, the lightening and thinning of AR products are realized using light waveguide technology. However, a high brightness of a display apparatus is required due to the large light loss in the optical waveguide. Therefore, an optical lens structure is generally arranged between the display apparatus and a color filter layer or arranged on the color filter layer to converge light, so as to increase the brightness of the light.

SUMMARY

As an aspect, an optical lens structure is provided. The optical lens structure includes a substrate layer; and a plurality of optical lenses on the substrate layer; wherein the optical lens includes a color resist material, the plurality of optical lenses are arranged in an array, and color resist materials of adjacent optical lenses have different colors from each other.

In an embodiment, the optical lens structure further includes a plurality of light shielding structures, wherein each of the plurality of light shielding structures is between two adjacent optical lenses and configured to block light transmitted through a region between the two adjacent optical lenses.

In an embodiment, the light shielding structure is formed by overlapped edges of two adjacent optical lenses with different colors of color resist materials, and an orthographic projection of the light shielding structure on the substrate layer overlaps an orthographic projection, on the substrate layer, of a region where edges of the two adjacent optical lenses overlap.

In an embodiment, the plurality of light shielding structures are formed by a black matrix, the plurality of light shielding structures are between the substrate layer and the plurality of optical lenses, and an orthographic projection of the light shielding structure on the substrate layer overlaps an orthographic projection of adjacent edges of the two adjacent optical lenses on the substrate layer.

In an embodiment, the plurality of light shielding structures are formed by a black matrix, the plurality of light shielding structures and the plurality of optical lenses are on a same side of the substrate layer, and an orthographic projection of the light shielding structure on the substrate layer and an orthographic projection of adjacent edges of the two adjacent optical lenses on the substrate layer are conterminous or continuous and do not overlap.

In an embodiment, the optical lens structure further includes a protective layer on a side of the plurality of optical lenses distal to the substrate layer and covering the plurality of optical lenses.

In an embodiment, a refractive index of the optical lens is greater than a refractive index of the protective layer.

As another aspect, a display apparatus including the optical lens structure above is provided.

In an embodiment, the display apparatus further includes a display device opposite to the optical lens structure; wherein the display device has display regions and non-display regions, the optical lens structure further includes a plurality of light shielding structures, each of the plurality of light shielding structures is between two adjacent optical lenses and configured to block light transmitted through a region between the two adjacent optical lenses, orthographic projections of the plurality of optical lenses on the substrate layer and orthographic projections of the display regions on the substrate layer overlap in one-to-one correspondence respectively, and orthographic projections of the plurality of light shielding structures on the substrate layer and orthographic projections of the non-display regions on the substrate layer overlap in one-to-one correspondence respectively.

In an embodiment, the optical lens has a circular shape, and the display region has a square shape.

In an embodiment, the display apparatus further includes an encapsulation layer between the display device and the plurality of optical lenses; wherein the encapsulation layer serves as the substrate layer of the optical lens structure.

In an embodiment, a thickness of the encapsulation layer is equal to a focal length of the optical lens.

In an embodiment, the display apparatus is an augmented reality display apparatus.

As still another aspect, a method for manufacturing an optical lens structure is provided. The method includes: forming a color resist material layer on a substrate layer, wherein the color resist material layer includes a plurality of color resist units with different colors from each other, the plurality of color resist units are arranged in an array, and adjacent color resist units have different colors from each other; and forming a plurality of optical lenses from the plurality of color resist units through a pattern process.

In an embodiment, forming the plurality of optical lenses from the plurality of color resist units through the pattern process includes performing a photolithography, embossing or copying process on the color resist material layer to form the plurality of optical lenses.

In an embodiment, performing the photolithography process on the color resist material layer includes coating photoresist on the color resist material layer; and exposing and developing the photoresist with a gray tone mask.

DETAILED DESCRIPTION

Exemplary embodiments of the present disclosure will be described in detail below with reference to the accompanying drawings to enable those skilled in the art to better understand the technical solutions of the present disclosure.

When the existing optical lens structure is integrated into an AR product, it is required that a color filter layer and the optical lens structure match with each other, thereby resulting in an increased process difficulty. At the same time, the color filter layer and optical lens structure that are provided separately may also increase the thickness of the AR product, which is not conducive to the lightening and thinning of the AR product and degrades the user experience.

Figure 1:
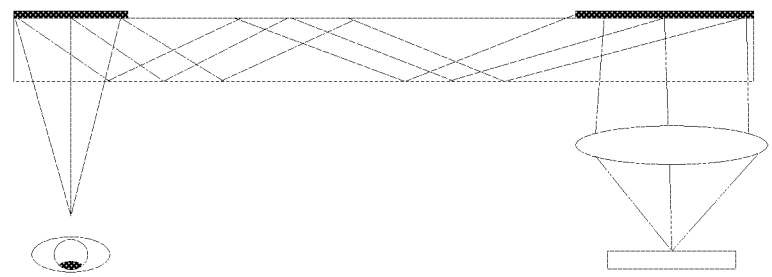
FIG. 1 is a schematic diagram showing a display principle of an AR product according to the related art.

FIG. 1 is a schematic diagram showing a display principle of an AR product according to the related art. As shown in FIG. 1, light generated by a display unit in an AR display product is converged by an optical lens structure, is incident into an optical waveguide through an incident holographic grating, propagates in the optical waveguide by total reflection, emits out of the optical waveguide through an outgoing holographic grating, and is incident into human eyes, thereby implementing display of the AR product. In a case of full-color display, a color filter layer for filtering the light generated by the display unit is provided to present a full-color display image. In the related art, the color filter layer and the optical lens structure are discrete layers in the AR product, and the color filter layer is required to match with the optical lens structure, thereby resulting in an increased process difficulty. At the same time, the color filter layer and optical lens structure that are provided separately may also increase the thickness of the AR product, which is riot conducive to the lightening and thinning of the AR product and degrades the user experience.

In order to solve the above problems in t related art, the present disclosure provides an optical lens structure, a method for manufacturing the same, and a display apparatus. It can be understood that the optical lens structure, the method for manufacturing the same and the display apparatus provided by the embodiments of the disclosure can be applied not only to the AR products, but also to other display products in which light needs to be converged. By taking the AR products as an example, the optical lens structure, the method for manufacturing the same and the display apparatus provided in the present disclosure will be further described in detail below with reference to the drawings and the detailed embodiments.

Figure 2:
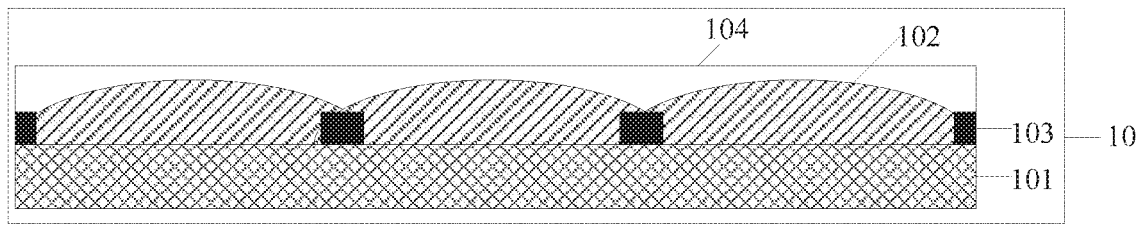
FIG. 2 is a schematic diagram showing an optical lens structure according to an embodiment of the present disclosure.

FIG. 2 is a schematic diagram showing an optical lens structure according to an embodiment of the present disclosure. As shown in FIG. 1, the optical lens structure 10 includes: a substrate layer 101, and a plurality of optical lenses 102 on the substrate layer 101. A material of the optical lens 102 includes a color resist material. The plurality of optical lenses 102 are arranged in an array, and color resist materials of adjacent optical lenses 102 have different colors from each other.

It should be noted that the color resist material may be a resin material for filtering light to obtain monochromatic light, and of course, the color resist material may also be other materials having a function of filtering light to obtain monochromatic light. The white light may be filtered into light with a single color such as red, green or blue through the color resist material, and a corresponding optical lens may be a red optical lens, a green optical lens, or a blue optical lens. In the embodiment of the present disclosure, the optical lenses 102 may be arranged in an array, for example, the optical lenses are sequentially arranged along a row direction in order of the red optical lens, the green optical lens, and the blue optical lens, and the color resist materials of three optical lenses 102 sequentially arranged along the row direction have different colors from each other.

The optical lenses 102 of the optical lens structure 10 in the embodiment of the present disclosure may converge light to increase the brightness of transmitted light, and thus increase the brightness of a display image and improve the display effect when the optical lens structure is applied to a display product. Moreover, the optical lens 102 may be made of a color resist material, that is, the color filter layer and the optical lens 102 in the related art are integrated. The optical lens may filter light while converging light without the color filter layer that is separately disposed, thereby avoiding matching between the color filter layer and the optical lenses 102 in the optical lens structure 10, and thus reducing process difficulty and manufacturing cost. Meanwhile, the optical lenses 102 may be made of a color resist material, which can reduce the thickness of the AR product, facilitate the lightening and thinning of the display product, and improve the user experience.

As shown in FIG. 2, the optical lens structure 10 in the embodiment of the present disclosure further includes a light shielding structure 103 formed by overlapped edges of two adjacent optical lenses 102 having different colors of color resist materials. An orthographic projection of the light shielding structure on the substrate layer overlaps an orthographic projection, on the substrate layer, of a region where the edges of the two adjacent optical lenses overlap.

It should be noted that in the embodiment of the present disclosure, the optical lenses 102 may be arranged along the row direction in order of a red optical lens, a green optical lens, and a blue optical lens, and two adjacent optical lenses 102 have different colors from each other. The red optical lens and the green optical lens may partially overlap to form the light shielding structure 103, the green optical lens and the blue optical lens may partially overlap to form the light shielding structure 103, and the blue optical lens and the red optical lens may partially overlap to form the light shielding structure 103. Since the two adjacent optical lenses 102 have the color resist materials with different colors, corresponding filtered light beams also have different colors from each other; and since each optical lens 102 can only filter light of one color, no light can transmit through the overlapped region between the two adjacent optical lenses when the two optical lenses 102 overlap. Therefore, the light shielding structure 103 can shield the light emitted to the region where the two adjacent optical lenses overlap, thereby preventing the color interference between the adjacent optical lenses 102 and the cross color between the lights filtered by the different optical lenses 102, and thus improving the display effect of the display product.

It should also be noted that the arrangement of the optical lenses can be designed as needed. For example, the color resist materials of two optical lenses adjacent along a column direction have different colors from each other, and in this case, a light shielding structure is formed between two optical lenses adjacent along the column direction. For another example, the color resist materials of two optical lenses adjacent along an oblique direction have different colors from each other, and in this case, a light shielding structure is formed between two optical lenses adjacent along the oblique direction. As long as the color resist materials of two optical lenses adjacent in a direction have different colors from each other, the light shielding structure 103 needs to be formed between the two adjacent optical lenses. An embodiment in which the color resist materials of three optical lenses arranged in sequence along the row direction have different colors is illustrated as an example.

In addition to forming the light shielding structure 103 through overlapped edges of two adjacent optical lenses 102, the light may be shielded with a black matrix (BM) that is separately provided, that is, the light shielding structure 103 is or formed by a black matrix. Therefore, the optical lens structure 10 further includes the light shielding structure 103 filled between the adjacent optical lenses 102 along the row direction, the detailed structure of which is shown in FIGS. 3 and 4.

Figure 3:
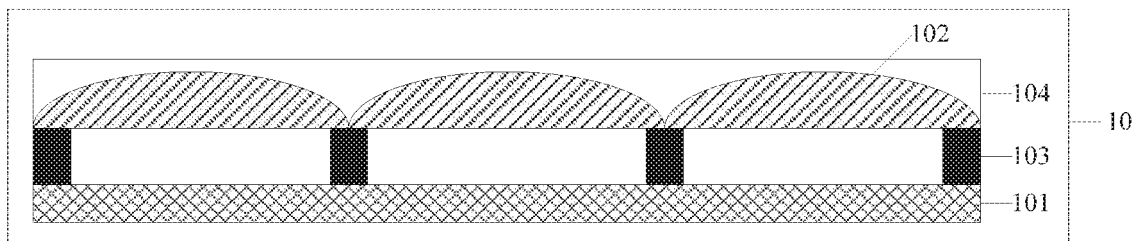
FIG. 3 is a schematic diagram showing an optical lens structure according to an embodiment of the present disclosure.

FIG. 3 is a schematic diagram showing an optical lens structure according to an embodiment of the present disclosure. As shown in FIG. 3, a layer of the light shielding structure 103 in the optical lens structure 10 in the embodiment of the present disclosure may be located between the substrate layer 101 and the plurality of optical lenses 102, and each light shielding structure 103 aligns to adjacent edges of the adjacent optical lenses 102. An orthographic projection of the light shielding structure 103 on the substrate layer 101 overlaps an orthographic projection of the adjacent edges of the optical lenses 102 on the substrate layer 101.

It should be noted that, in the embodiment of the present disclosure, a plurality of light shielding structures 103 spaced apart from each other may be separately disposed between the substrate layer 101 and the optical lenses 102. A transparent material may be filled between the light shielding structures 103, and light may transmit through the transparent material between the light shielding structures 103. The light shielding structure 103 can shield light transmitted through the edge of the optical lens 102, thereby avoiding color cross between light beams filtered by different optical lenses 102, and improving the display effect of the display product.

Figure 4:
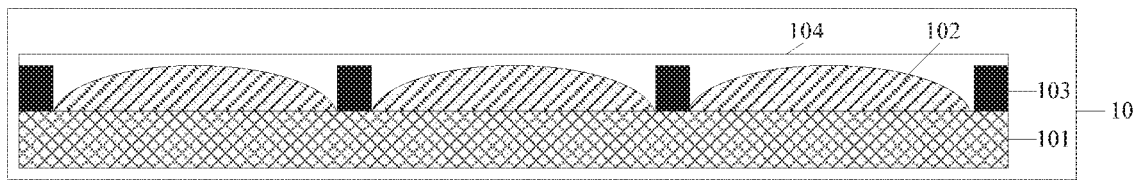
FIG. 4 is a schematic diagram showing an optical lens structure according to an embodiment of the present disclosure.

FIG. 4 is a schematic diagram showing an optical lens structure according to an embodiment of the present disclosure. As shown in FIG. 4, the light shielding structure 103 of the optical lens structure 10 in the embodiment of the present disclosure may be located between adjacent optical lenses 102, and the light shielding structure 103 and the plurality of optical lenses 102 are located on a same side of the substrate layer 101. An orthographic projection of the light shielding structure 103 on the substrate layer 101 and an orthographic projection of an edge of the optical lens 102 on the substrate layer 101 are adjacent to each other and conterminous or continuous, and do not overlap.

It should be noted that, in the embodiment of the present disclosure, the light shielding structure 103 may be disposed between two adjacent optical lenses 102, and a thickness of the light shielding structure 103 is equal to or greater than a thickness of the optical lens 102, so that the light shielding structure 103 can shield light filtered by the optical lens 102, thereby avoiding the color cross between light filtered by different optical lenses 102, and improving the display effect of the display product. Meanwhile, since the light shielding structure 103 is located between adjacent optical lenses 102, it is not necessary to provide a discrete layer for shielding light, thereby reducing the thickness of the layers, facilitating the lightening and thinning of the display product, and further improving the user experience.

It can be understood that, as shown in FIG. 2, FIG. 3 and FIG. 4, in the entire optical lens structure 10, the same light shielding structure 103 may be disposed at edges of the optical lens structure 10, so as to avoid light leakage at the edges of the optical lens structure 10, and improve the display effect.

As shown in FIGS. 2, 3 and 4, the optical lens structure 10 provided in the embodiment of the present disclosure may further include a protective layer 104 on a side of the plurality of optical lenses 102 distal to the substrate layer 101.

It should be noted that the protective layer 104 may be made of a transparent material and cover the optical lenses 102 to obtain a flat surface of the optical lenses 102, which facilitates bonding with other layers in the display product and protection of the optical lenses 102, thereby avoiding damage to the optical lenses 102 due to external force during the manufacture and usage of the display product.

In an embodiment, a refractive index of the optical lens 102 is greater than a refractive index of the protective layer 104.

It should be noted that since the optical lens 102 has a larger refractive index, the optical lens 102 can effectively converge the light and enhance the brightness of the light. The protective layer 104 has a smaller refractive index, which can avoid interference with the propagation of light transmitted through the optical lens 102.

Figure 5:
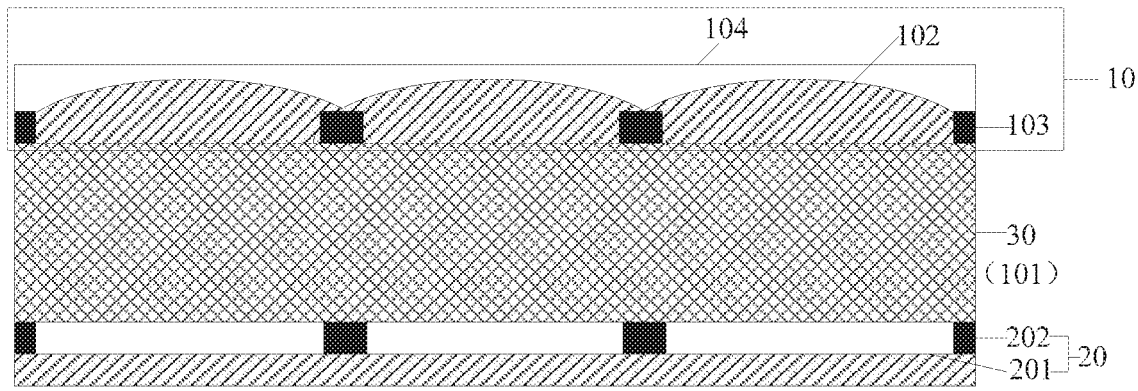
FIG. 5 is a schematic diagram showing a display apparatus according to an embodiment of the present disclosure.

The embodiment of the disclosure provides a display apparatus, and FIG. 5 is a schematic diagram showing a display apparatus according to an embodiment of the present disclosure. As shown in FIG. 5, the display apparatus may include the optical lens structure 10 according to the above embodiments.

It will be appreciated that the optical lens structure 10 in the embodiments of the present disclosure may have the structure shown in FIG. 2, 3 or 4. For convenience of description, the embodiment of the present disclosure in which the optical lens structure 10 in the display apparatus has the structure shown in FIG. 2 is described as an example.

In the embodiment of the present disclosure, the optical lens structure 10 in the display apparatus can filter light while converging light without the color filter layer that is separately disposed, thereby reducing process difficulty and manufacturing cost. Meanwhile, the optical lenses 102 may be made of a color resist material, which can reduce the thickness of the layers, facilitate the lightening and thinning of the AR product, and improve the user experience.

In an embodiment, as shown in FIG. 5, the display apparatus in the embodiment of the present disclosure further includes a display device 20 disposed opposite to the optical lens structure 10. The display device has display regions 201 and non-display regions 202. The optical lenses 102 are in one-to-one correspondence to the display regions 201, and the light shielding structures 103 are in one-to-one correspondence to the non-display regions 202. An orthographic projection of the optical lens 102 on the substrate layer 101 overlaps an orthographic projection of the display region 201 on the substrate layer 101, and an orthographic projection of the light shielding structure 103 on the substrate layer 101 overlaps an orthographic projection of the non-display region 202 on the substrate layer 101.

It should be noted that the display device 20 in the display apparatus can emit light under the control of the data voltage, and the non-display region 202 can avoid interference between light of different colors. The optical lenses 102 may be in one-to-one correspondence to the display regions 201, and the light shielding structures 103 may be in one-to-one correspondence to the non-display regions 202. The light generated by the display device 20 may be incident to the optical lens 102, and the optical lens 102 may converge the light, and filter the light into light of a single color, so as to meet the requirements of the display apparatus on convergence and filtering of the light.

In an embodiment, the orthographic projections of the optical lenses 102 on the display device 20 cover the display regions 201.

It should be noted that, in practical applications, the optical lenses 102 may be in one-to-one correspondence to the display regions 201, and an area of the optical lens 102 is slightly larger than an area of the display region 201, so that the optical lens 102 can completely converge and filter light generated by a device in a corresponding display region 201, thereby avoiding light leakage.

In an embodiment, the optical lens 102 has a circular shape, and the display region 201 has a square shape.

It should be noted that, in practical applications, the optical lens 102 may have a circle shape, and the display region 201 may have a square shape, which not only facilitates the manufacturing of the optical lens 102 and the display device, but also facilitates the optical lens 102 to completely converge and filter the light generated by the device in the corresponding display region 201. Of course, the optical lens 102 and the display region 201 may have other shapes, which are not listed here.

As shown in FIG. 5, the display apparatus further includes: an encapsulation layer 30 on the display device 20. The encapsulation layer 30 may serve as the substrate layer 101 of the optical lens structure 10.

It should be noted that the encapsulation layer 30 can encapsulate and protect the display device 20, so as to prevent the circuit structure in the display device 20 from being damaged by substances such as air or water. Meanwhile, the encapsulation layer 30 may have a certain thickness to provide space and distance that facilitates the optical lens 102 to converge the light generated by the display device 20.

In an embodiment, a thickness of the encapsulation layer 30 is equal to a focal length of the optical lens 102.

It should be noted that the thickness of the encapsulating layer 30 may be equal to the focal length of the optical lens 102, so that the display device 20 can be located at the focal point of the optical lens 102, thereby obtaining the optimum converging effect of the optical lens 102 on the light generated by the display device 20. It is understood that the thickness of the encapsulation layer 30 may also be smaller than the focal length of the optical lens 102, thereby reducing the thickness of the layers while good convergence can be ensured. The thickness of the encapsulation layer 30 can be designed properly as needed.

In an embodiment, the display apparatus is an augmented reality display apparatus.

It should be noted that the display apparatus in the embodiment of the present disclosure may be an augmented reality display apparatus, the intensity of light generated by the display device 20 may be increased, and light loss caused by the optical waveguide can be avoided, thereby meeting the requirement of the augmented reality display device on the light brightness, and improving the augmented reality display effect.

In an embodiment, the display device 20 includes a light emitting device which is an organic light emitting diode.

It should be noted that the display device 20 in the display apparatus may include a light emitting device which is an organic light emitting diode. The organic light emitting diode may emit light under the control of the data voltage.

Of course, the display device 20 may further include a switching device and a driving device, and the like, and the light emitting principle thereof is the same as that of the organic light emitting diode in the related art, and is not described herein again.

Figure 6:
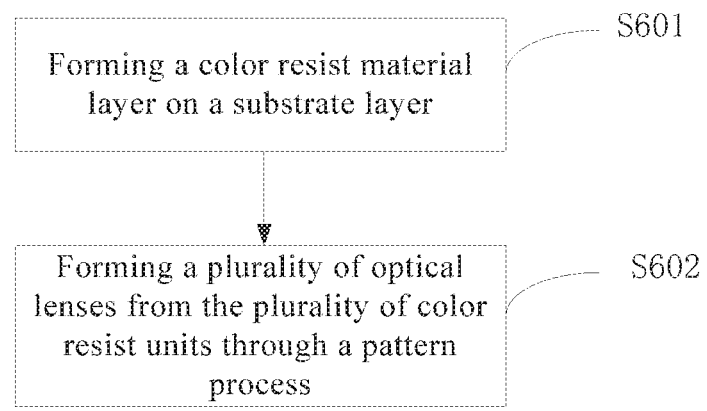
FIG. 6 is a flow chart showing a method of manufacturing an optical lens structure according to an embodiment of the present disclosure.

The embodiment of the present disclosure provides a method for manufacturing an optical lens structure, which may be used for manufacturing the optical lens structure in the above embodiments, and FIG. 6 is a flow chart showing a method of manufacturing an optical lens structure according to an embodiment of the present disclosure. As shown in FIG. 6, the method for manufacturing the optical lens structure includes steps S601 and S602.

At step S601, a color resist material layer is formed on the substrate layer.

At step S601, the color resist material layer, e.g., a color filter layer in the related art, may be formed on the substrate layer 101, and the color resist material layer may be made of a resin material or other materials with a light filtering effect. The color resist material layer can include a plurality of color resist units with different colors for filtering light of different colors. The color resist units are arrange in an array, and adjacent color resist units have different colors from each other.

At step S602, the color resist material layer is formed into a plurality of optical lenses though a pattern process.

At step S602, the shape of each color resist unit in the color resist material layer may be changed through a pattern process, so that each color resist unit forms an optical lens having both filtering and converging functions. The plurality of optical lenses can be arranged in an array, and adjacent optical lenses have different colors from each other.

In an embodiment, at step S602, the color resist material layer is formed into a plurality of optical lenses through a pattern process. In an embodiment, the shapes of the color resist units can be changed through a photolithography, embossing or copying process, so as to form the optical lenses. When the optical lens structure shown in FIG. 4 is manufactured, the optical lenses may be formed through for example a printing process.

In an embodiment, the photolithography process on the color resist material layer may include: coating photoresist on the color resist material layer; and exposing and developing the photoresist with a gray tone mask. When the photolithography process is performed with the gray tone mask, the resulted optical lens has a curvature radius with an accuracy of ±0.5 microns and the roughness less than 10 nanometers, so that the accuracy of the manufactured optical lens can be improved.

It should be understood that the above embodiments are merely exemplary embodiments for the purpose of showing the principles of the present disclosure. However, the present disclosure is not limited thereto. It will be apparent to those skilled in the art that various changes and modifications can be made without departing from the essence and spirit of the present disclosure, which are also to be regarded as falling within the scope of the present disclosure.

What is claimed is:

1. An optical lens structure, comprising:
a substrate layer; and
a plurality of optical lenses on the substrate layer;
wherein the optical lens comprises a color resist material, the plurality of optical lenses are arranged in an array, and
color resist materials of adjacent optical lenses have different colors from each other, each of the plurality of optical lenses comprises a flat surface functioning as a light incident surface and a convex-lens-shaped surface opposite to the flat surface,
the optical lens structure further comprises a plurality of light shielding structures, and each of the plurality of light shielding structures is between two adjacent optical lenses and configured to block light transmitted through a region between the two adjacent optical lenses,
the light shielding structure is formed by overlapped edges of two adjacent optical lenses with different colors of color resist materials, and
an orthographic projection of the light shielding structure on the substrate layer overlaps an orthographic projection, on the substrate layer, of a region where edges of the two adjacent optical lenses overlap.

2. The optical lens structure according to claim 1, further comprising a protective layer on a side of the plurality of optical lenses distal to the substrate layer and covering the plurality of optical lenses.

3. The optical lens structure according to claim 2, wherein a refractive index of the optical lens is greater than a refractive index of the protective layer.

4. A display apparatus, comprising the optical lens structure according to claim 1.

5. The display apparatus according to claim 4, further comprising: a display device opposite to the optical lens structure;
wherein the display device has display regions and non-display regions,
the optical lens structure further comprises a plurality of light shielding structures, each of the plurality of light shielding structures is between two adjacent optical lenses and configured to block light transmitted through a region between the two adjacent optical lenses,
orthographic projections of the plurality of optical lenses on the substrate layer and orthographic projections of the display regions on the substrate layer overlap in one-to-one correspondence respectively, and
orthographic projections of the plurality of light shielding structures on the substrate layer and orthographic projections of the non-display regions on the substrate layer overlap in one-to-one correspondence respectively.

6. The display apparatus according to claim 5, wherein the optical lens has a circular shape, and
the display region has a square shape.

7. The display apparatus according to claim 6, further comprising an encapsulation layer between the display device and the plurality of optical lenses;
wherein the encapsulation layer serves as the substrate layer of the optical lens structure.

8. The display apparatus according to claim 7, wherein a thickness of the encapsulation layer is equal to a focal length of the optical lens.

9. The display apparatus according to claim 4, wherein the display apparatus is an augmented reality display apparatus.

10. An optical lens structure, comprising:
a substrate layer; and
a plurality of optical lenses on the substrate layer;
wherein the optical lens comprises a color resist material, the plurality of optical lenses are arranged in an array, and
color resist materials of adjacent optical lenses have different colors from each other, each of the plurality of optical lenses comprises a flat surface functioning as a light incident surface and a convex-lens-shaped surface opposite to the flat surface,
the optical lens structure further comprises a plurality of light shielding structures, and each of the plurality of light shielding structures is between two adjacent optical lenses and configured to block light transmitted through a region between the two adjacent optical lenses,
the plurality of light shielding structures are formed by a black matrix,
the plurality of light shielding structures and the plurality of optical lenses are on a same side of the substrate layer, and
an orthographic projection of the light shielding structure on the substrate layer and an orthographic projection of adjacent edges of the two adjacent optical lenses on the substrate layer are conterminous and do not overlap.

11. The optical lens structure according to claim 10, further comprising a protective layer on a side of the plurality of optical lenses distal to the substrate layer and covering the plurality of optical lenses.

12. The optical lens structure according to claim 11, wherein a refractive index of the optical lens is greater than a refractive index of the protective layer.

13. A method for manufacturing an optical lens structure, comprising:
forming a color resist material layer on a substrate layer, wherein the color resist material layer comprises a plurality of color resist units with different colors, the plurality of color resist units are arranged in an array, and adjacent color resist units have different colors from each other; and
forming a plurality of optical lenses from the plurality of color resist units through a pattern process, such that each of the plurality of optical lenses comprises a flat surface functioning as a light incident surface and a convex-lens-shaped surface opposite to the flat surface,
the method further comprises forming a plurality of light shielding structures, such that:
each of the plurality of light shielding structures is between two adjacent optical lenses and configured to block light transmitted through a region between the two adjacent optical lenses,
the light shielding structure is formed by overlapped edges of two adjacent optical lenses with different colors of color resist materials, and
an orthographic projection of the light shielding structure on the substrate layer overlaps an orthographic projection, on the substrate layer, of a region where edges of the two adjacent optical lenses overlap.

14. The method according to claim 13, wherein forming the plurality of optical lenses from the plurality of color resist units through the pattern process comprises:
performing a photolithography, embossing or copying process on the color resist material layer to form the plurality of optical lenses.

15. The method according to claim 14, wherein performing the photolithography process on the color resist material layer comprises:
- coating photoresist on the color resist material layer; and
- exposing and developing the photoresist with a gray tone mask.

* * * * *